United States Patent
Street et al.

(10) Patent No.: US 10,580,720 B1
(45) Date of Patent: Mar. 3, 2020

(54) SILICON INTERPOSER WITH FUSE-SELECTABLE ROUTING ARRAY

(71) Applicant: Micron Technology, Inc., Boise, ID (US)

(72) Inventors: Bret K. Street, Meridian, ID (US); Owen R. Fay, Meridian, ID (US); Eiichi Nakano, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/166,428

(22) Filed: Oct. 22, 2018

(51) Int. Cl.
| | | |
|---|---|---|
| *H01L 23/48* | (2006.01) | |
| *H01L 21/66* | (2006.01) | |
| *H01L 23/14* | (2006.01) | |
| *H01L 23/00* | (2006.01) | |
| *H01L 23/525* | (2006.01) | |
| *H01L 21/48* | (2006.01) | |
| *H01L 23/532* | (2006.01) | |

(52) U.S. Cl.
CPC ........ *H01L 23/481* (2013.01); *H01L 21/4846* (2013.01); *H01L 22/32* (2013.01); *H01L 23/147* (2013.01); *H01L 23/5256* (2013.01); *H01L 24/80* (2013.01); *H01L 23/53295* (2013.01); *H01L 2924/10253* (2013.01); *H01L 2924/1431* (2013.01)

(58) Field of Classification Search
CPC ... H01L 21/4846; H01L 22/32; H01L 23/147; H01L 23/481; H01L 23/5256; H01L 23/53295; H01L 24/80; H01L 2924/10253
See application file for complete search history.

(56) References Cited

U.S. PATENT DOCUMENTS

| | | | | |
|---|---|---|---|---|
| 2009/0173530 | A1* | 7/2009 | Sakamoto | H01L 21/4857 174/261 |
| 2009/0230977 | A1* | 9/2009 | Vacar | G01R 31/2808 324/538 |
| 2012/0001294 | A1* | 1/2012 | Kim | H01L 23/5256 257/529 |
| 2013/0113070 | A1* | 5/2013 | Chiu | H01L 23/49827 257/529 |
| 2014/0266286 | A1* | 9/2014 | Ramachandran | G06F 17/5068 324/759.01 |
| 2016/0218083 | A1* | 7/2016 | Kariyazaki | H01L 25/0655 |
| 2017/0343603 | A1* | 11/2017 | Chakrabarty | G01R 31/44 |
| 2019/0121560 | A1* | 4/2019 | Keeth | G06F 3/0632 |

* cited by examiner

*Primary Examiner* — Allan R Wilson
(74) *Attorney, Agent, or Firm* — Parsons Behle & Latimer

(57) ABSTRACT

A silicon interposer that includes an array, or pattern, of conductive paths positioned within a silicon substrate with a plurality of pins on the exterior of the substrate. Each of the pins is connected to a portion of the array of conductive paths. The array of conductive paths is configurable to provide a first electrical flow path through the substrate via a portion of the array of conductive paths or a second electrical flow path through the substrate. The electrical flow path through the substrate may be customizable for testing various die or chip layout designs. The electrical flow path through the substrate may be customizable by laser ablation of portions of the conductive paths, breaking of fuses along the conductive paths, and/or the actuation of logic gates connected to the conductive paths.

19 Claims, 5 Drawing Sheets

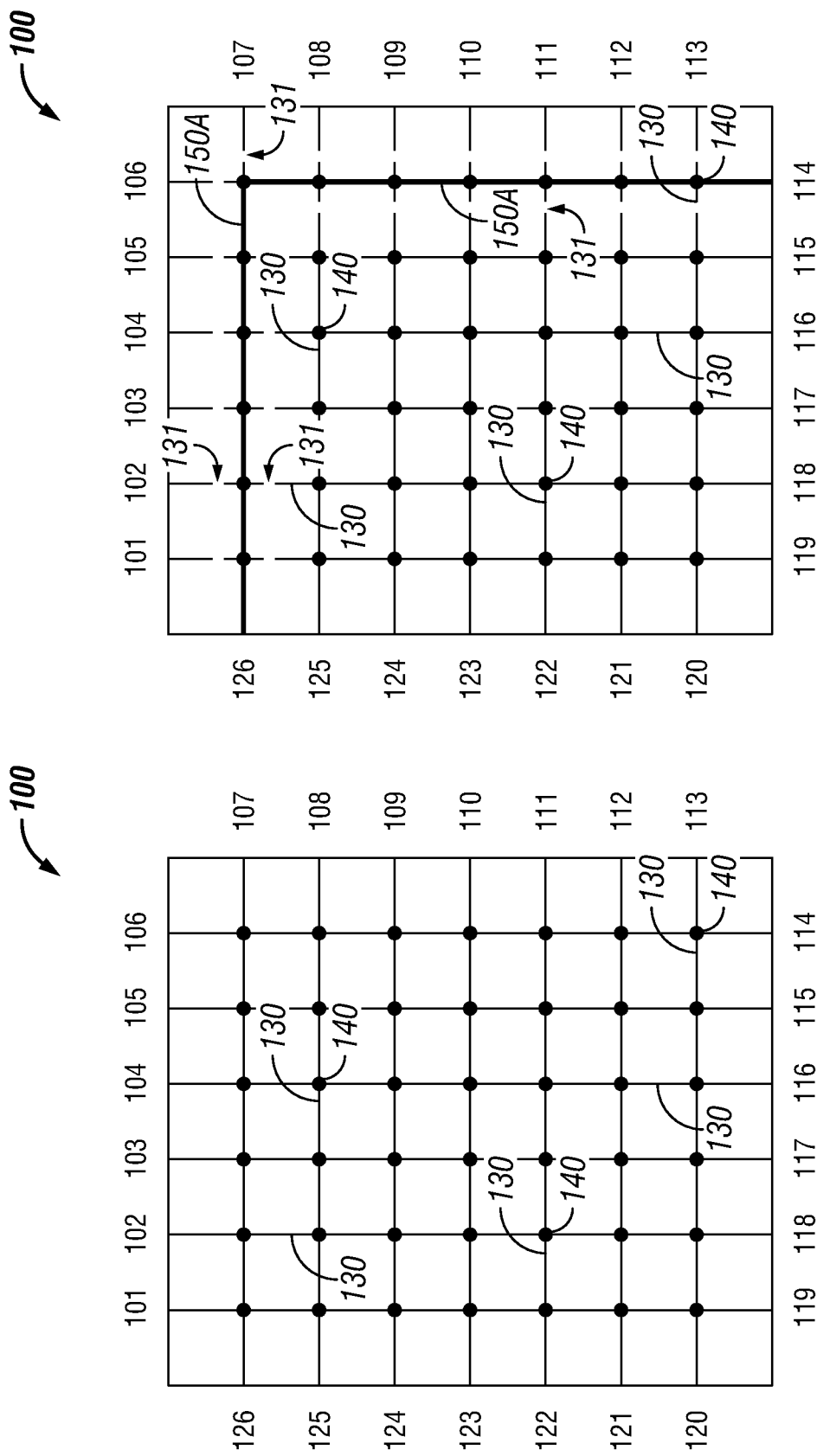

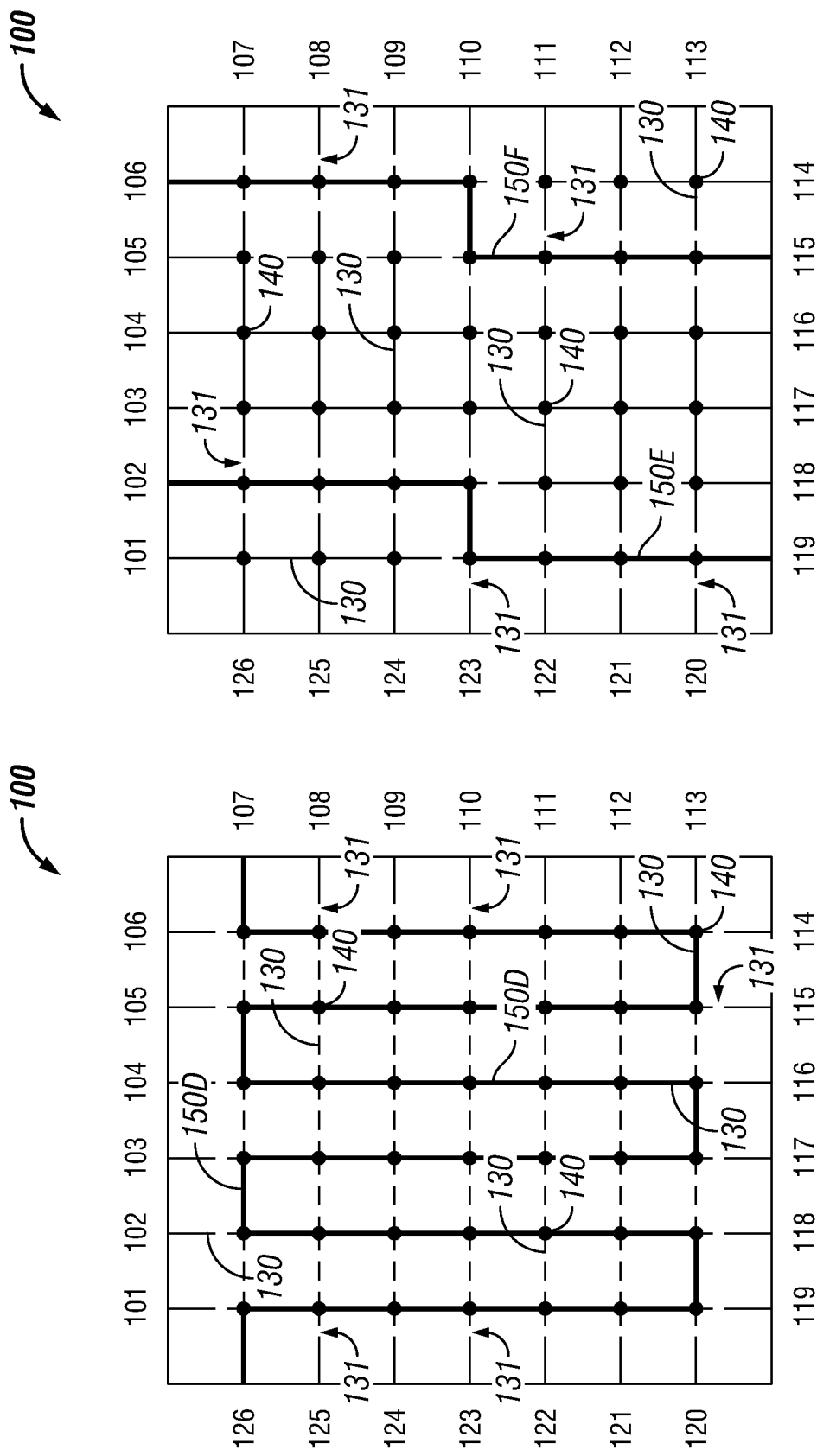

SILICON INTERPOSER WITH FUSE-SELECTABLE ROUTING ARRAY

FIELD

The embodiments described herein relate to a substrate, such as a silicon interposer, having an array, or pattern, of conductive paths positioned within the substrate, and a plurality of pins on an exterior of the substrate, with each pin being connected to a portion of the array of conductive paths. The array of conductive paths is configurable to various electrical flow paths through the substrate using portions of the array of conductive paths.

BACKGROUND

Semiconductor device assemblies, which may include, but are not limited to, memory chips, microprocessor chips, imager chips, and the like, may provide various functional features, such as memory cells, processor circuits, and imager devices. New chip or die layouts are constantly being designed to provide new functionality and/or to improve current functionality.

As various chip or die layouts are designed, a custom silicon interposer is typically formed that includes a custom electrical flow path that may be used to test the new layout design. There are a number of different parameters that may be tested using the silicon interposer. For example, the signal integrity of a path may be tested. As another example, the overall speed of the layout may be tested. If the layout design does not pass one of the test, changes may need to be made to the design layout, which may require a silicon interposer having a different custom flow path be produced. The creation of a custom silicon interposer for each iteration of a layout design can be expensive and/or time consuming. Additional drawbacks and disadvantages may exist.

BRIEF DESCRIPTION OF THE DRAWINGS

FIG. 1 is a schematic of one embodiment of a silicon interposer having a configurable array of conductive paths positioned within the silicon interposer.

FIG. 2 is a schematic of one embodiment of a silicon interposer with the array of conductive paths configured to provide an electrical pathway through the silicon interposer.

FIG. 5 is a schematic of one embodiment of a silicon interposer with the array of conductive paths configured to provide an electrical pathway through the silicon interposer.

FIG. 6 is a schematic of one embodiment of a silicon interposer with the array of conductive paths configured to provide two electrical pathways through the silicon interposer.

Figure 4:
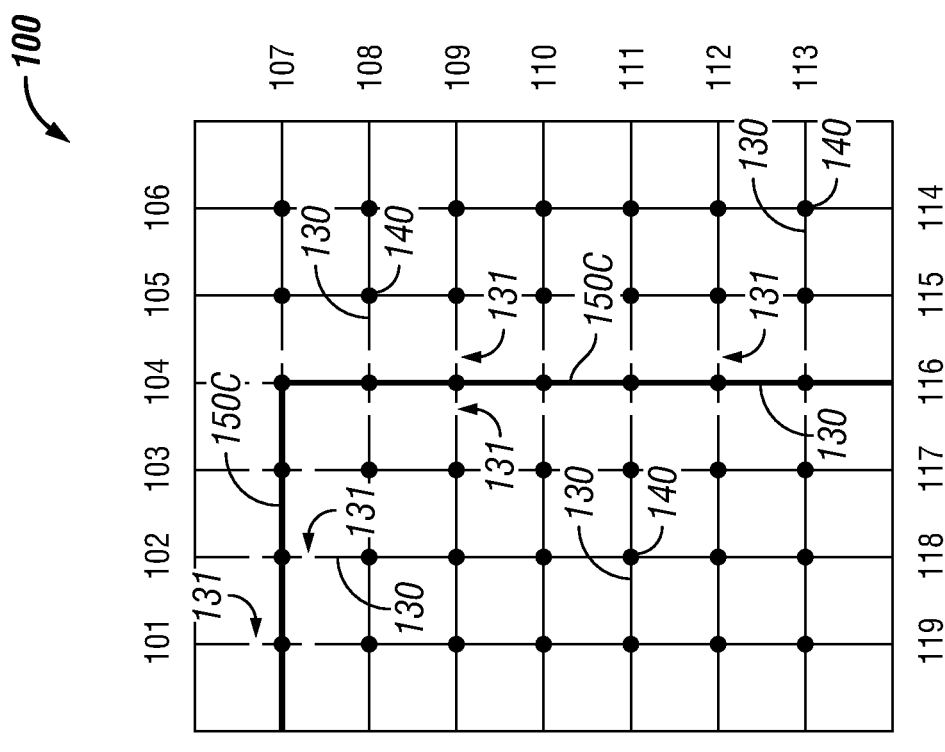
FIG. 4 is a schematic of one embodiment of a silicon interposer with the array of conductive paths configured to provide an electrical pathway through the silicon interposer.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices and semiconductor device packages may not be shown and/or may not be described in detail to avoid obscuring other aspects of the disclosure. In general, it should be understood that various other devices, systems, and/or methods in addition to those specific embodiments disclosed herein may be within the scope of the present disclosure.

The terms "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, semiconductor device packages, and methods of making and/or operating semiconductor devices.

An embodiment of the disclosure is a silicon interposer comprising a substrate, an array of conductive paths positioned within the substrate, and a plurality of pins on an exterior of the substrate, with each pin being connected to a portion of the array of conductive paths. The array of conductive paths is configurable to provide a first electrical flow path through the substrate via a portion of the array of conductive paths.

An embodiment of the disclosure is a silicon interposer comprising a substrate and an array of conductive paths positioned within the substrate. The silicon interposer includes a plurality of device connected to the array of conductive paths, wherein the plurality of devices are configured to change an electrical flow path through the silicon interposer.

An embodiment of the disclosure is a method of making a silicon interposer comprising providing a silicon substrate and forming an array of conductive paths positioned within the substrate. The method includes providing a plurality of pins connected to the array of conductive paths and forming a first electrical pathway though the silicon substrate from a first pin to a second pin.

FIG. 1 is a schematic of one embodiment of a substrate 100, which may be a silicon interposer, having an array, or pattern, of conductive paths 130 within the substrate 100. The array of conductive paths 130 may be configured in a universal pattern, such as a uniform grid, the enables a large number of electrical flow paths through the substrate 100 as discussed herein. The array of conductive paths 130 is connected to a plurality of pins 101-126 positioned along the exterior of the substrate 100. The array of conductive paths 130 includes a plurality of nodes 140 at intersections along the array of conductive paths 130. The array of conductive paths 130 is shown as a two-dimensional array for clarity. However, the array of conductive paths 130 may be a three-dimensional array within the substrate 100. For example, each node 140 may be connected to a vertical pathway through the substrate 100 to enable the node 140 to be connected to a semiconductor device on a top surface of the substrate 100 as would be appreciated by one of ordinary skill in the art having the benefit of this disclosure.

A discrete electrical flow path through the substrate 100 may be created to enable testing of semiconductor devices connected to the substrate 100 as discussed herein. The uniform array of conductive paths 130 is shown for illustrative purposes and may be varied depending on the application as would be appreciated by one of ordinary skill in the art having the benefit of this disclosure. For example, the size, shape, configuration, and/or number of conductive paths 130, nodes 140, and/or pins 101-126 may be varied.

FIG. 2 is a schematic of one embodiment of a substrate 100, which may be a silicon interposer, having a first electrical flow path 150A through the substrate 100. A pattern, or pathway, has been created in the array of conductive paths 130 to provide an electrical flow path 150A between pin 126 and pin 114. Specifically, a plurality of breaks, or opens, 131 have been created along the array of conductive paths 130 to provide the electrical flow path 150A between pin 126 and pin 114. The electrical flow path 150A through the substrate 100 is shown as a two-dimensional electrical flow path for clarity purpose. The electrical flow path may include both horizontal and vertical paths along an array of flow paths 130 as would be appreciated by one of ordinary skill in the art having the benefit of this disclosure.

Figure 7:
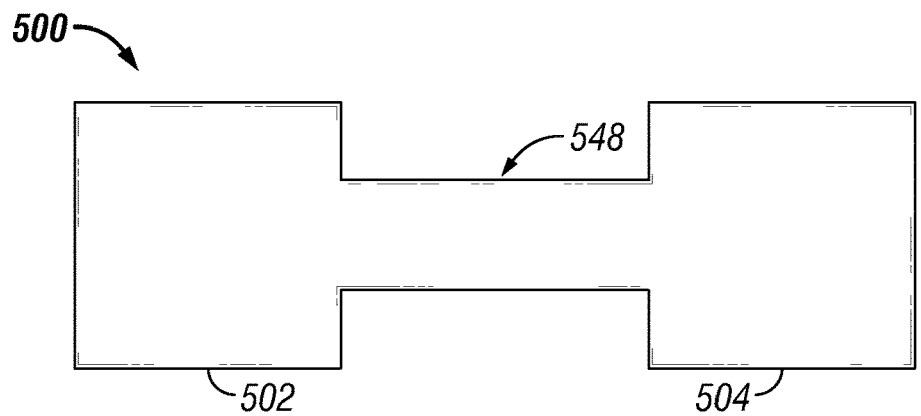
FIG. 7 depicts an embodiment of an electrical connection circuit with a laser ablation portion.

The breaks, or opens, 131 along the array of conductive paths 130 may be formed various ways. For example, laser ablation may be used to form a plurality of breaks 131 along the array of conductive paths 130 to form an electrical flow or electrical flow paths through the substrate 100. Referring to FIG. 7, an embodiment of an electrical connection circuit 500 with a laser ablation portion 548 is depicted. The laser ablation portion may be an electrical runner that is susceptible to laser ablation. The electrical connection circuit 500 may be used to connect two nodes 140 of the conductive paths 130, i.e. conductors, within a substrate 100, such as a silicon interposer.

The electrical connection circuit 500 may include a first electrode 502 and a second electrode 504. Each of the first electrode 502 and the second electrode 504 may be configured to be electrically coupled conductive paths 130 within a substrate. A laser ablation portion 548 may be exposed on a surface of the substrate. By exposing the laser ablation portion 548, a laser may be used to remove the laser ablation portion 548, thereby severing the electrical connection circuit 500 between the first electrode 502 and the second electrode 504. The laser ablation and severing of a plurality of electrical connections connected to the conductive paths 130 within a substrate 100 may be used to form an electrical flow path through the substrate. As such, the substrate may be configured to provide various predefined electrical flow paths.

Figure 9:
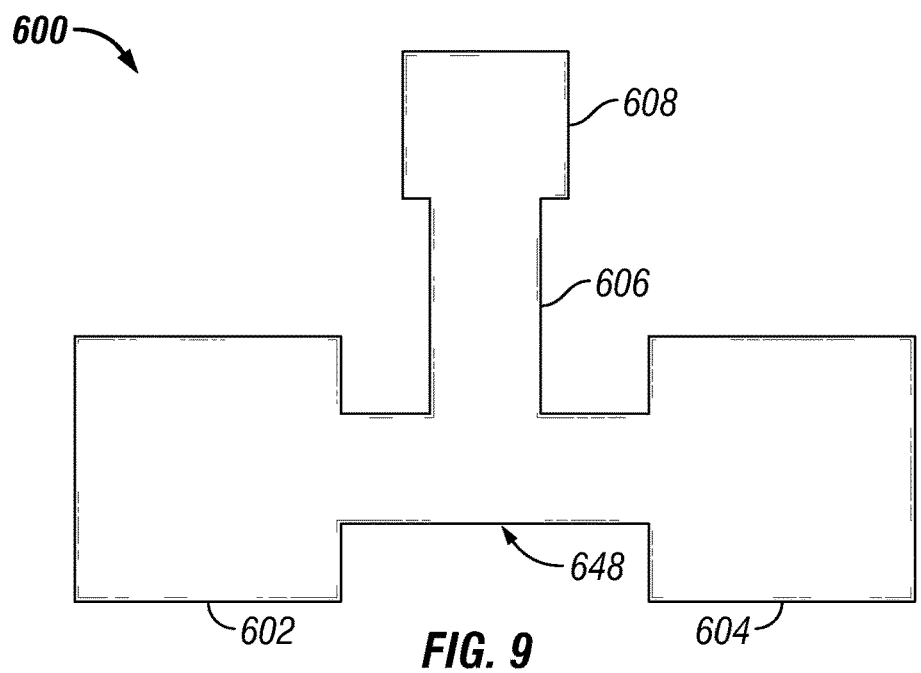
FIG. 9 depicts an embodiment of an electrical connection circuit with a fuse.

The break of a plurality of fuses along the array of conductive paths 130 is another way to form the plurality of breaks 131 along the array of conductive paths 130 to provide an electrical flow path or electrical flow paths through the substrate 100. Referring to FIG. 9, an embodiment of an electrical connection circuit 600 with a fuse 648 is depicted. The electrical connection circuit 600 may be used to connect two nodes 140 of the conductive paths 130 within a substrate 100, such as a silicon interposer.

The electrical connection circuit 600 may include a first electrode 602 and a second electrode 604 connected by a fuse 648. Each of the first electrode 602 and the second electrode 604 may be configured to be electrically coupled conductive paths 130 within a substrate. The electrical connection circuit 600 may further include a pin 608 and a connector 606. By applying a current to the pin 608, the fuse 648 may be blown and the first electrode 602 may be disconnected from the second electrode 604. The connector 606 may be robust enough to limit breakdown only to the fuse 648, thereby ensuring that an electrical connection between the first electrode 602 and the second electrode 604 is severed.

The breaking of a plurality of fuses connected to the conductive paths 130 within a substrate 100 may be used to form an electrical flow path through the substrate. As such, the substrate may be configured to provide various different electrical flow paths. The fuses 648 may be configured or enabled to be reconnected and broken more than once enabling the conductive paths 130 within a substrate 100 to be reconfigured to provide different flow paths as would be appreciated by one of ordinary skill in the art having the benefit of this disclosure.

Figure 3:
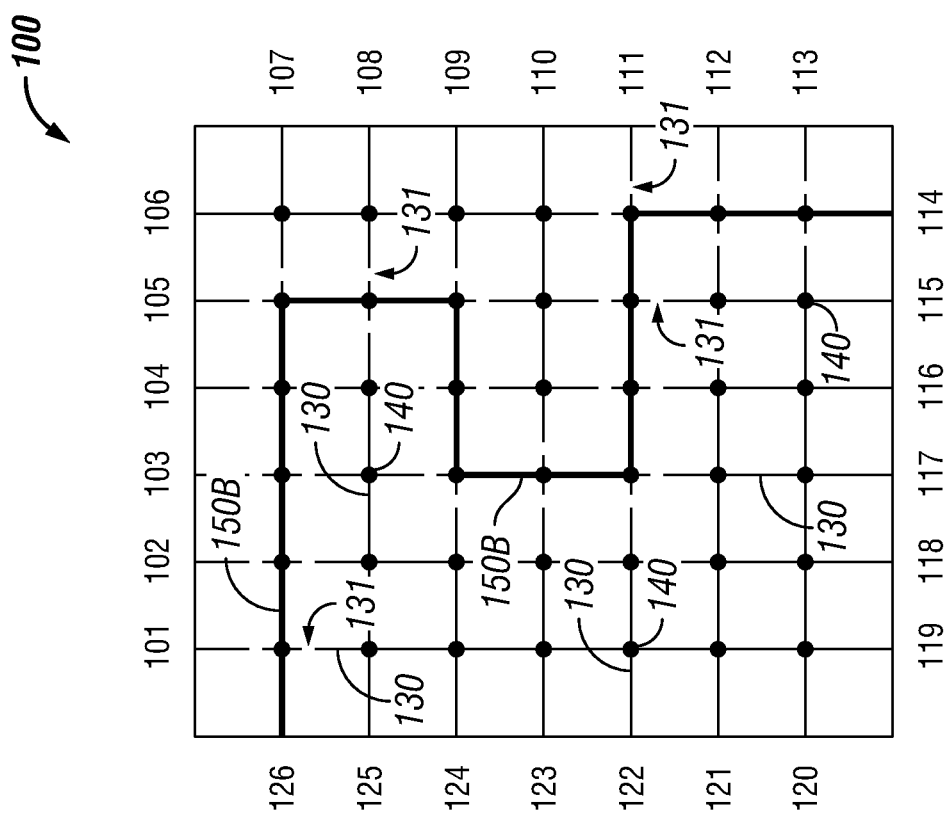
FIG. 3 is a schematic of one embodiment of a silicon interposer with the array of conductive paths configured to provide an electrical pathway through the silicon interposer.

FIG. 3 is a schematic of one embodiment of a substrate 100, which may be a silicon interposer, having a second electrical flow path 150B through the substrate 100. A pattern, or pathway, has been created in the array of conductive paths 130 to provide an electrical flow path 150B between pin 126 and pin 114. The second electrical flow path 150B includes the same end points, pins 114 and 126, as the first electrical flow path 150A. However, the second flow path 150B has a different length than the first flow path of FIG. 2. The array of conductive paths 130 is configurable to enable a plurality of different electrical flow paths to be formed through the substrate 100 as would be appreciated by one of ordinary skill in the art having the benefit of this disclosure.

A plurality of breaks, or opens, 131 have been created along the array of conductive paths 130 to provide the electrical flow path 150A between pin 126 and pin 114. The electrical flow path 150A through the substrate 100 is shown as a two-dimensional electrical flow path for clarity purpose. The electrical flow path may include both horizontal and vertical paths along an array of flow paths 130 as would be appreciated by one of ordinary skill in the art having the benefit of this disclosure.

FIG. 4 is a schematic of one embodiment of a substrate 100, which may be a silicon interposer, having a third electrical flow path 150C through the substrate 100. A pattern, or pathway, has been created in the array of conductive paths 130 to provide an electrical flow path 150C between pin 126 and pin 116. The array of conductive paths 130 is configurable to enable a plurality of different electrical flow paths to be formed through the substrate 100 as would be appreciated by one of ordinary skill in the art having the benefit of this disclosure. A plurality of breaks, or opens, 131 have been created along the array of conductive paths 130 to provide the electrical flow path 150A between pin 126 and pin 114. The array of conductive paths 130 enables the substrate 100 to be used to test a plurality of die or chip layouts as would be appreciated by one of ordinary skill in the art having the benefit of this disclosure.

FIG. 5 is a schematic of one embodiment of a substrate 100, which may be a silicon interposer, having a fourth electrical flow path 150D through the substrate 100. A pattern, or pathway, has been created in the array of conductive paths 130 to provide an electrical flow path 150C between pin 126 and pin 107. The array of conductive paths 130 is configurable to enable a plurality of different electrical flow paths to be formed through the substrate 100 as would be appreciated by one of ordinary skill in the art having the benefit of this disclosure. A plurality of breaks, or opens, 131 have been created along the array of conductive paths 130 to provide the electrical flow path 150A between pin 126 and pin 114. The array of conductive paths 130 enables the substrate 100 to vary the length of an electrical flow path through the substrate 100. The fourth electrical flow path 150D may be used to generate heat due to the long length of the flow path. The electrical flow path through the substrate may be configured to similar the amount of heat expected to be generated by a semiconductor device enabling the substrate 100 and electrical flow path 150D to temperature test one or more semiconductor devices connected to the substrate 100.

FIG. 6 is a schematic of one embodiment of a substrate 100, which may be a silicon interposer, having a fifth electrical flow path 150E and a sixth electrical flow path 150F through the substrate 100. Pattern, or pathways, have been created in the array of conductive paths 130 to provide a fifth electrical flow path 150E between pin 102 and pin 119 and a sixth electrical flow path 150F between pin 106 and pin 115. The array of conductive paths 130 is configurable to enable a plurality of different electrical flow paths to be formed through the substrate 100 as would be appreciated by one of ordinary skill in the art having the benefit of this disclosure. A plurality of breaks, or opens, 131 have been created along the array of conductive paths 130 to provide the electrical paths through the substrate 100. The array of conductive paths 130 may be configured to have two or more electrical paths through the substrate 100 as would be appreciated by one of ordinary skill in the art having the benefit of this disclosure.

Figure 8:
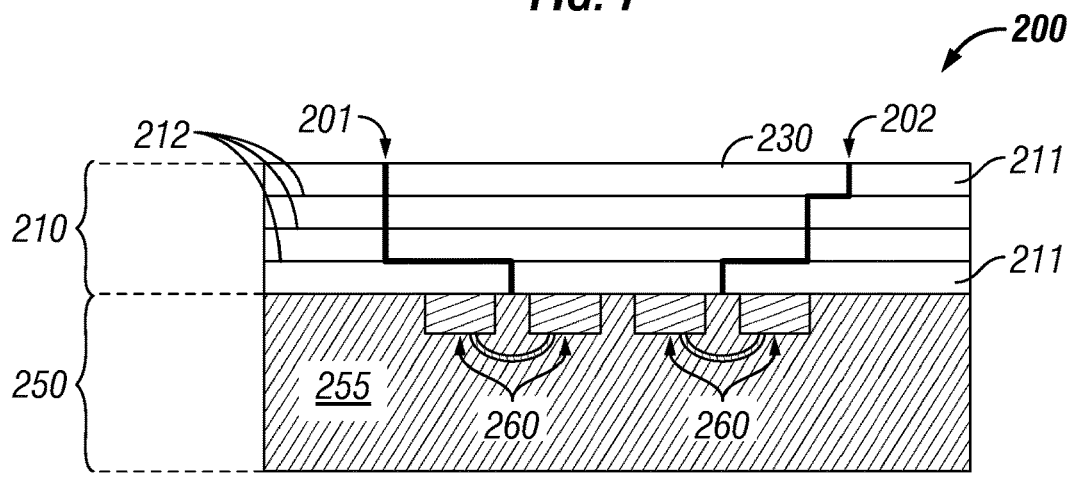
FIG. 8 is a cross-section schematic of one embodiment of a silicon interposer having a configurable array of conductive paths positioned within the silicon interposer.

FIG. 8 is a cross-section schematic of one embodiment of a substrate, such as a silicon interposer, 200 having a configurable array of conductive paths positioned within the substrate 200. The substrate 200 includes a first portion 210 and a second portion 210. The first portion 210 of the substrate 200 includes a plurality of conductive layers 212 separated by dielectric layers 211. The first portion 210 includes an array of conductive paths that include the conductive layers 212 as well as electrical path ways 201 and 202. Only a portion of the array of conductive paths is shown for clarity. The second portion 250 of the substrate 200 includes a plurality of logic gates 260 positioned within dielectric material 255. The logic gates 260 are connected to portions of the array of conductive paths and may be used to configure electrical flow paths through the substrate 200. For example, the logic gates 260 in a first state may permit electrical flow through a first electrical flow path 201 and the logic gates 260 in a second state may permit electrical flow through a second electrical flow path 202. The logic gates 260 may be formed in the dielectric material 255 via complementary metal-oxide-semiconductor processing. The number of logic gates 260 shown in FIG. 8 is for illustrative purposes and may be varied depending on the application. Logic gates 260 may be used as another mechanism to selectively configure the electrical flow paths through a substrate 200 as would be appreciated by one of ordinary skill in the art having the benefit of this disclosure.

Figure 10:
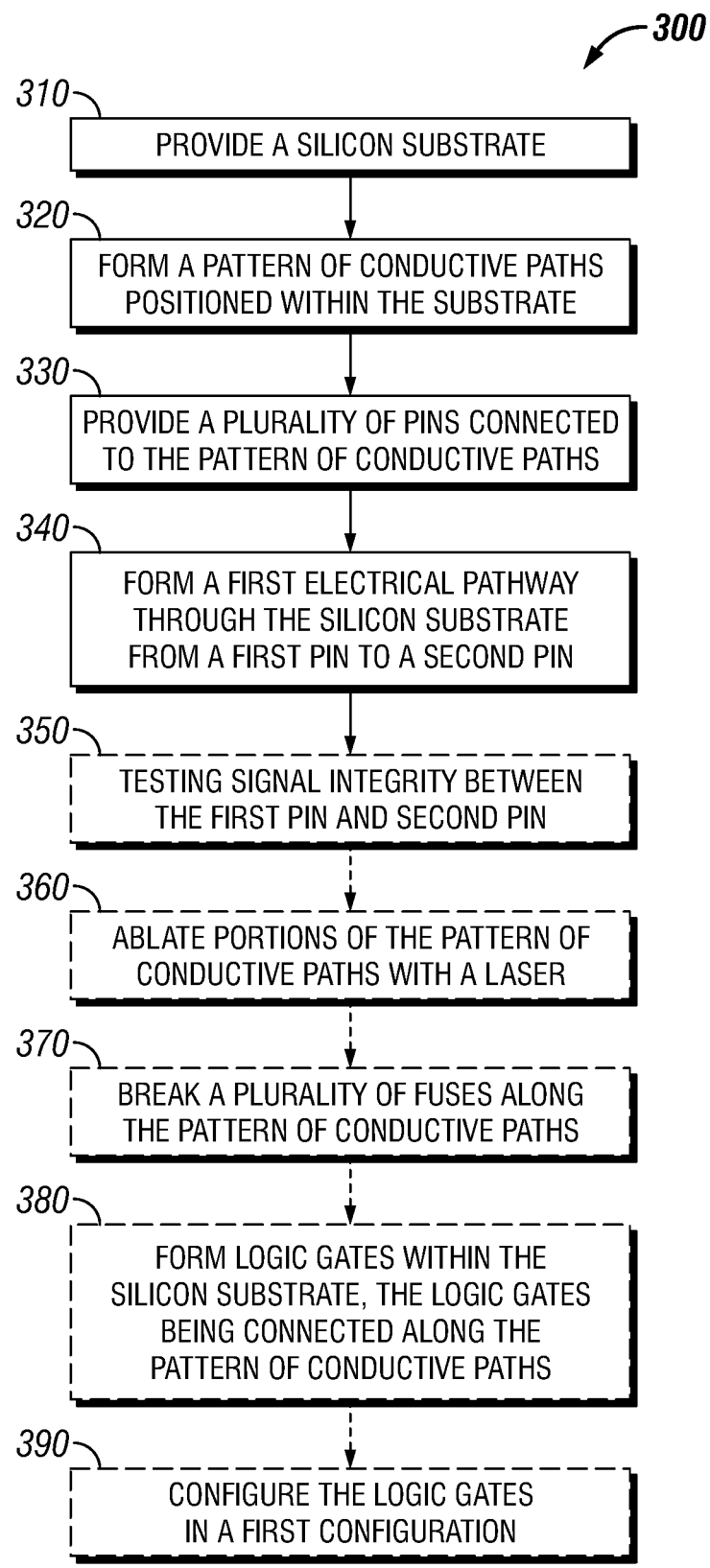
FIG. 10 is a flow chart of one embodiment of a method of making a silicon interposer having a configurable array of conductive paths positioned within the silicon interposer.

FIG. 10 is a flow chart of one embodiment of a method 300 of making a silicon interposer having a configurable array of conductive paths positioned within the silicon interposer. The method 300 includes providing a silicon substrate, at 310. For example, the silicon substrate may be silicon interposer. The method 300 includes forming a pattern, or array, of conductive paths positioned within the substrate, at 320. The pattern, or array, may be a uniform grid within the substrate. The pattern, or array, may be other shapes or configurations as would be appreciated by one of ordinary skill in the art. At 330, the method 300 include provide a plurality of pins connected to the pattern, or array, of conductive paths. The pins are connected to the array and permit the testing of one or more electrical flow paths through the substrate.

The method 300 include forming a first electrical pathway through the silicon substrate from a first pin to a second pin, at 340. The method 300 may include testing signal integrity between the first pin and the second pin, at 350. As discussed herein, the electrical pathway may be formed by various mechanisms. For example, the method 300 may include ablating portions of the patter, or array, of conductive paths with a laser. The ablation breaks portions of the pattern, or array, of the conductive paths to form a discrete electrical pathway through the substrate. The method 300 may include breaking a plurality of fuses along the pattern of conductive paths, at 370. The breaking of the fuses forms a discrete electrical pathway through the substrate. The method 300 may include forming logic gates within the silicon substrate, the logic gates being connected along the pattern, or array, of conductive paths, at 380. At 390, the method 300 may include configured the logic gates in a first configuration. With the logic gates in a first configuration, a discrete electrical flow pathway may be formed within the silicon substrate. The logic gates in a different configuration provides a different discrete electrical flow pathway through the silicon substrate. Various configurations of the logic gates change the electrical flow path, or paths, through the silicon substrate as would be appreciated by one of ordinary skill in the art having the benefit of this disclosure.

A silicon substrate, such as a silicon interposer, is herein disclosed that includes a configurable array, or pattern, of conductive pathways that may be selectively configured to provide one or more discrete electrical flow pathways through the substrate. The silicon substrate may be used to test various die or chip layouts eliminating the need to design a custom silicon interposer to test each new layout. Instead, the array, or pattern, of conductive pathways is configured to provide a plurality of electrical pathways that may be used to perform such tests by simple modification of the conductive pathways. For example, the conductive pathways may be modified by laser ablation, breaking of fuses, and/or the like. Additionally, the conductive pathways may be repeatedly configured using logic gates positioned along the conductive pathways.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A silicon interposer comprising:
a substrate;
an array of conductive paths positioned within the substrate;
a plurality of pins on an exterior of the substrate, each pin connected to the array of conductive paths;
wherein the array of conductive paths is configurable to provide a first electrical flow path through the substrate via a portion of the array of conductive paths; and
at least one logic gate connected to the array of conductive paths, the at least one logic gate having a first state that provides the first electrical flow path through the substrate.

2. The silicon interposer of claim 1, wherein the first electrical flow path is between a first pin and a second pin of the plurality of pins.

3. The silicon interposer of claim 2, wherein the array of conductive paths is configurable to provide a second electrical flow path between the first pin and the second pin, the second electrical flow path have a different length than a length of the first electrical flow path.

4. The silicon interposer of claim 3, wherein the array of conductive paths is configurable to provide a third electrical flow path between a third pin and a fourth pin of the plurality of pins.

5. The silicon interposer of claim 1, wherein the at least one logic gate has a second state that provides a second electrical flow path through the substrate.

6. The silicon interposer of claim 1, wherein the array of conductive paths is configurable to generate heat to test a semiconductor device connected to the silicon interposer.

7. The silicon interposer of claim 1, wherein the substrate includes a first portion and a second portion and wherein the array of conductive paths is positioned within the first portion and the at least one logic gate is positioned within the second portion.

8. The silicon interposer of claim 7, wherein the first portion includes a plurality of conductive layers separated by dielectric layers and the second portion is comprised of dielectric material.

9. A silicon interposer comprising:
a silicon substrate;
an array of conductive paths positioned within the silicon substrate;
a plurality of devices connected to the array of conductive paths, wherein the plurality of devices are configured to change an electrical flow path through the silicon substrate; and
wherein the plurality of devices comprises a plurality of logic gates, wherein various configurations of the logic gates change the electrical flow path through the silicon substrate.

10. The silicon interposer of claim 9, wherein the silicon substrate includes a first portion and a second portion and wherein the array of conductive paths is positioned within the first portion and the plurality of logic gates are positioned within the second portion.

11. The silicon interposer of claim 10, wherein the first portion includes a plurality of conductive layers separated by dielectric layers and the second portion is comprised of dielectric material.

12. A method of making a silicon interposer comprising:
providing a silicon substrate;
forming an array of conductive paths positioned within the silicon substrate;
providing a plurality of pins connected to the array of conductive paths;
forming a first electrical pathway through the silicon substrate from a first pin to a second pin; and
forming logic gates within the silicon substrate, the logic gates being electrically connected along the array of conductive paths.

13. The method of claim 12, comprising testing signal integrity between the first pin and the second pin.

14. The method of claim 12, wherein forming the first electrical pathway through the silicon substrate comprises configuring the logic gates in a first configuration.

15. The method of claim 14, wherein the logic gates in the first configuration permit electrical flow through the first electrical pathway.

16. The method of claim 15, comprising configured the logic gates in a second configuration.

17. The method of claim 16, wherein the logic gates in the second configuration permit electrical flow though a second electrical pathway.

18. The method of claim 12, the silicon substrate includes a first portion and a second portion, wherein the conductive paths are formed within the first portion and the logic gates are formed in the second portion.

19. The method of claim 18, wherein the first portion includes a plurality of conductive layers separated by dielectric layers and the second portion is comprised of dielectric material.

* * * * *